(12) United States Patent
Cheng et al.

(10) Patent No.: US 11,380,824 B2
(45) Date of Patent: Jul. 5, 2022

(54) LIGHT-EMITTING DEVICE AND MANUFACTURING METHOD THEREOF

(71) Applicant: EPISTAR CORPORATION, Hsinchu (TW)

(72) Inventors: Ching-Tai Cheng, Hsinchu (TW); Shau-Yi Chen, Hsinchu (TW); Yih-Hua Renn, Hsinchu (TW); Wei-Shan Hu, Hsinchu (TW); Pei-Hsuan Lan, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/990,121

(22) Filed: Aug. 11, 2020

(65) Prior Publication Data

US 2020/0373468 A1 Nov. 26, 2020

Related U.S. Application Data

(63) Continuation of application No. 16/262,116, filed on Jan. 30, 2019, now Pat. No. 10,741,734.

(30) Foreign Application Priority Data

Feb. 1, 2018 (TW) .................................. 107103645
Nov. 6, 2018 (TW) .................................. 107139377

(51) Int. Cl.
*H01L 33/50* (2010.01)
*H01L 25/075* (2006.01)
(Continued)

(52) U.S. Cl.
CPC ........ *H01L 33/505* (2013.01); *H01L 25/0753* (2013.01); *H01L 33/44* (2013.01);
(Continued)

(58) Field of Classification Search
CPC ... H01L 33/505; H01L 25/0753; H01L 33/44; H01L 33/504; H01L 33/60;
(Continued)

(56) References Cited

U.S. PATENT DOCUMENTS 8,742,433 B2 * 6/2014 Ajiki ................... H01L 25/0753
257/88
9,391,051 B2 * 7/2016 Rhee ..................... H01L 33/507
(Continued)

FOREIGN PATENT DOCUMENTS

CN 107086226 A 8/2017

*Primary Examiner* — Earl N Taylor
(74) *Attorney, Agent, or Firm* — Patterson + Sheridan, LLP

(57) ABSTRACT

The application discloses a light-emitting device including a carrier, a light-emitting element and a connecting structure. The carrier includes a first connecting portion and a first necking portion extended from the first connecting portion. The first connecting portion has a first width, and the first necking portion has a second width. The second width is less than the first width. The light-emitting element includes a first light-emitting layer being able to emit a first light and a first contacting electrode formed under the first light-emitting layer. The first contacting electrode is corresponded to the first connecting portion. The connecting structure includes a first electrical connecting portion and a protecting portion surrounding the first electrical connecting portion. The first electrical connecting portion is electrically connected to the first connecting portion and the first contacting electrode. The first connecting portion substantially is located within a range surrounded by the protecting portion.

7 Claims, 12 Drawing Sheets

(51) Int. Cl.
  *H01L 33/44* (2010.01)
  *H01L 33/60* (2010.01)
(52) U.S. Cl.
  CPC ............ *H01L 33/504* (2013.01); *H01L 33/60* (2013.01); *H01L 2933/0025* (2013.01); *H01L 2933/0041* (2013.01); *H01L 2933/0058* (2013.01)
(58) Field of Classification Search
  CPC ..... H01L 2933/0025; H01L 2933/0041; H01L 2933/0058; H01L 33/483; H01L 33/62; H01L 33/58; H01L 33/54; H01L 33/0095; H01L 27/156; H01L 33/50; H01L 33/52; H01L 33/005
  See application file for complete search history.

(56) References Cited

U.S. PATENT DOCUMENTS

| | | | | |
|---|---|---|---|---|
| 9,905,543 | B2* | 2/2018 | Yeon | H01L 33/504 |
| 10,361,248 | B2* | 7/2019 | Lee | H01L 27/153 |
| 10,388,838 | B2* | 8/2019 | Hung | H01L 33/0075 |
| 10,497,681 | B2* | 12/2019 | Hung | H01L 33/60 |
| 2008/0290351 | A1* | 11/2008 | Ajiki | H01L 25/0753 |
| | | | | 257/88 |
| 2009/0207111 | A1* | 8/2009 | Wang | G09F 9/33 |
| | | | | 345/83 |
| 2010/0001299 | A1* | 1/2010 | Chang | F21K 9/00 |
| | | | | 257/89 |
| 2012/0087108 | A1* | 4/2012 | Ke | H01L 25/0753 |
| | | | | 362/97.1 |
| 2014/0264412 | A1* | 9/2014 | Yoon | H01L 33/504 |
| | | | | 257/98 |
| 2015/0362165 | A1* | 12/2015 | Chu | H01L 27/156 |
| | | | | 362/235 |
| 2016/0273716 | A1* | 9/2016 | Tarsa | F21K 9/232 |
| 2017/0084587 | A1* | 3/2017 | Hung | H01L 33/60 |
| 2017/0092820 | A1* | 3/2017 | Kim | H01L 33/50 |
| 2017/0099709 | A1* | 4/2017 | Loveridge | H05B 45/20 |
| 2017/0117963 | A1* | 4/2017 | Mueller | H04B 10/116 |
| 2017/0236866 | A1* | 8/2017 | Lee | H01L 33/505 |
| | | | | 257/89 |
| 2017/0250316 | A1* | 8/2017 | Yeon | H01L 25/0753 |
| 2017/0286044 | A1* | 10/2017 | Kim | H01L 27/3265 |
| 2018/0123001 | A1* | 5/2018 | Hung | H01L 33/486 |
| 2018/0138378 | A1* | 5/2018 | Hung | H01L 33/56 |
| 2018/0166424 | A1* | 6/2018 | Sim | H01L 25/0753 |
| 2018/0211942 | A1* | 7/2018 | Hung | H01L 33/54 |
| 2019/0189595 | A1* | 6/2019 | Lee | H01L 27/1214 |
| 2019/0198716 | A1* | 6/2019 | Gordon | H01L 27/156 |
| 2019/0212614 | A1* | 7/2019 | Kwak | G02F 1/133514 |
| 2019/0237637 | A1* | 8/2019 | Cheng | H01L 33/504 |

* cited by examiner

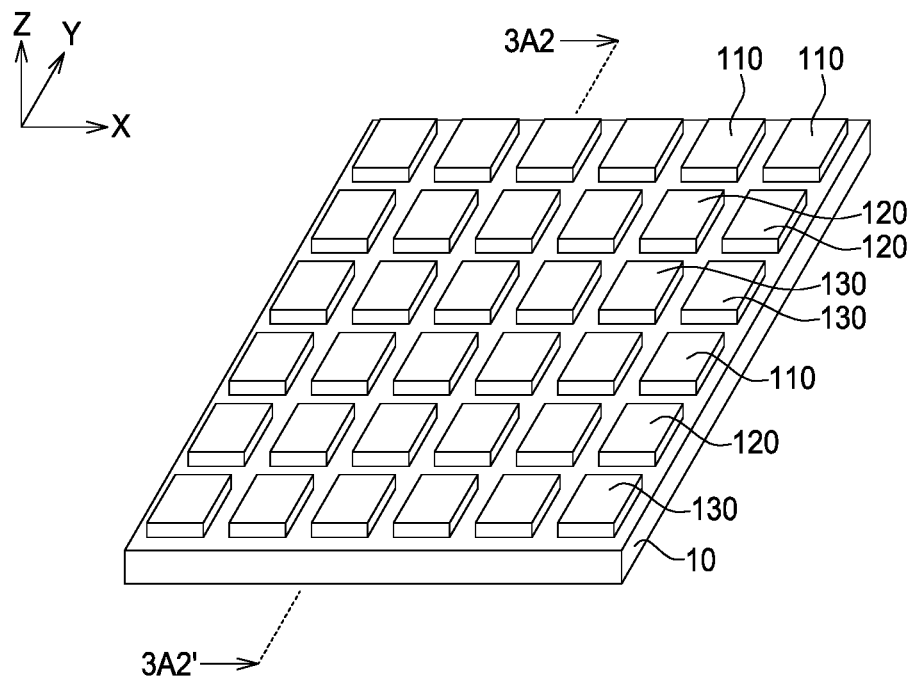
FIG. 3A1
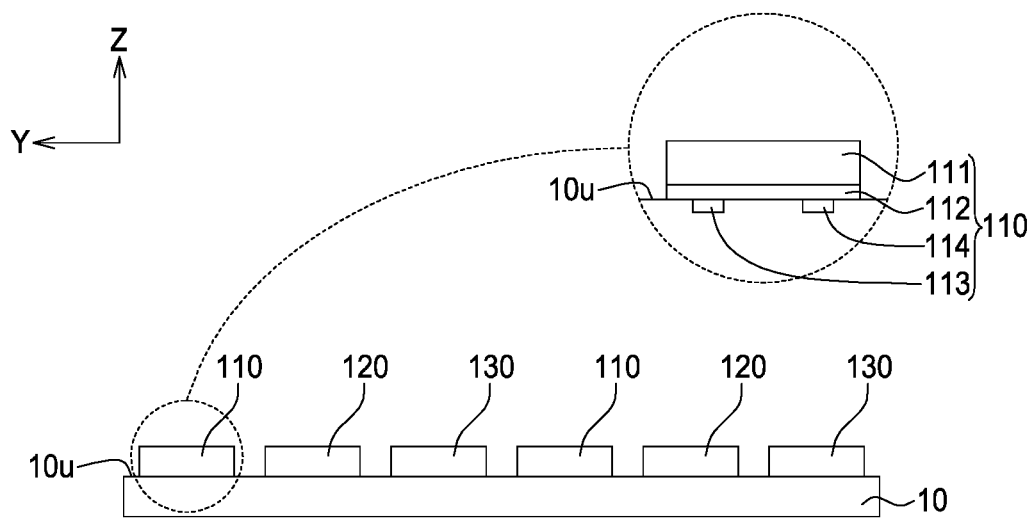
FIG. 3A2

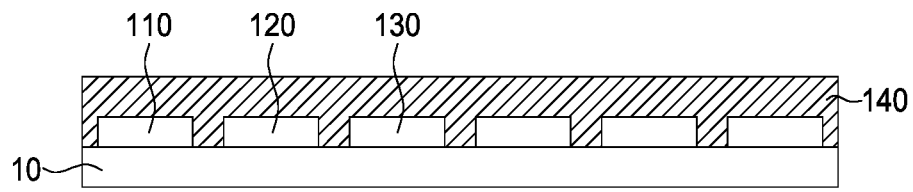
FIG. 3B
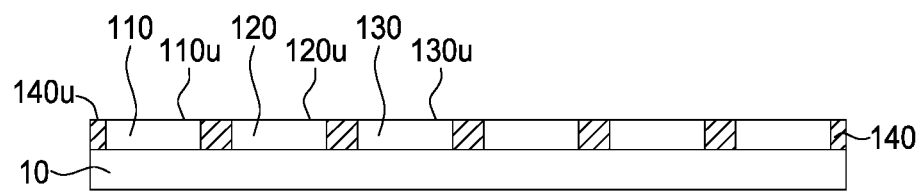
FIG. 3C
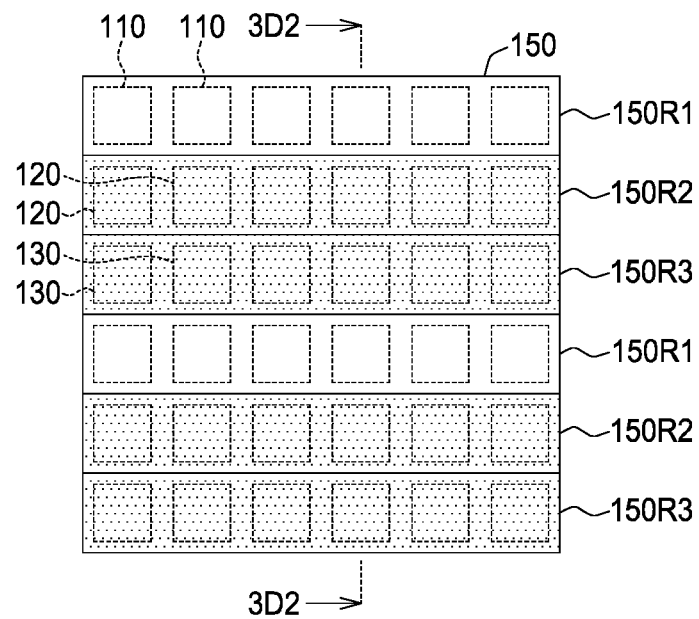
FIG. 3D1

FIG. 3D2

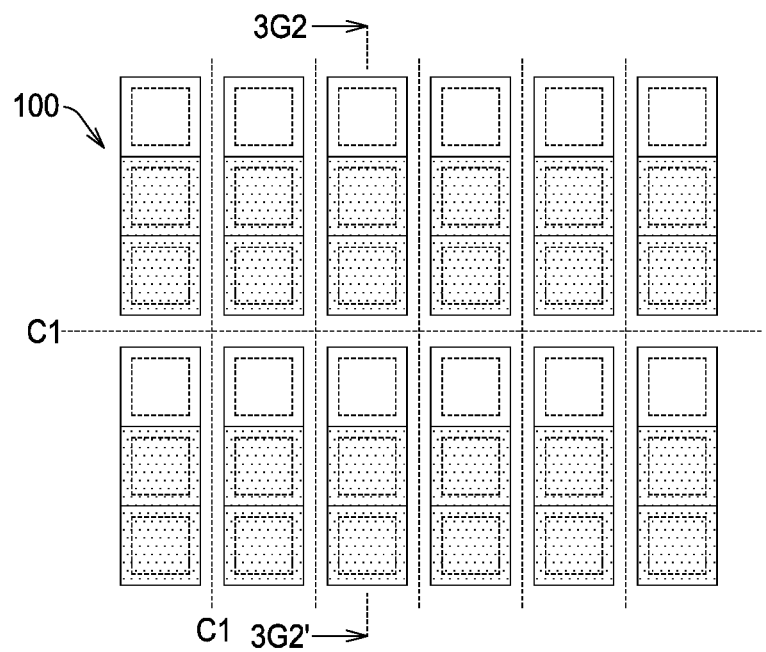
FIG. 3G1
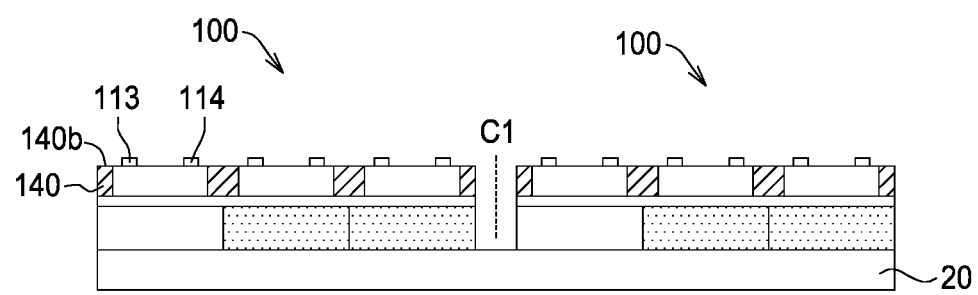
FIG. 3G2

LIGHT-EMITTING DEVICE AND MANUFACTURING METHOD THEREOF

RELATED APPLICATION DATA

This is a continuation of U.S. patent application Ser. No. 16/262,116, filed Jan. 30, 2019 which claims the right of priority of TW Application No. 107139377, filed on Nov. 6, 2018, which claim the right of domestic priority of TW Application No. 107103645, filed on Feb. 1, 2018, and the content of which is hereby incorporated by reference in its entirety.

TECHNICAL FIELD

The application is related to a light-emitting device and a manufacturing method thereof, and specially related to a light-emitting device with multiple light-emitting units and a manufacturing method thereof.

DESCRIPTION OF BACKGROUND ART

Traditional light-emitting device includes a metal bracket, a light-emitting diode, sealing and a reflector. The light-emitting diode and the reflector are disposed on the metal bracket, wherein the light-emitting diode is in the reflector and the sealing covers the light-emitting diode. However, this light-emitting device generally emits light with only one peak wavelength or only one color, which limits its application fields.

SUMMARY OF THE DISCLOSURE

According to one embodiment of this application, a light-emitting device is disclosed. The light-emitting device includes a first light-emitting unit, a second light-emitting unit, a reflective dam and a color layer. The first light-emitting unit is used for emitting a first light with a peak wavelength not larger than 500 nm. The second light-emitting unit is used for emitting a second light with a peak wavelength not larger than 500 nm. The reflective dam is disposed between the first light-emitting unit and the second light-emitting unit and surrounds the first and second light-emitting units. The color layer includes a first region and a second region. The first region covers the first light-emitting unit and allows the first light directly penetrate thereof, and the second region covers the second light-emitting unit and converts the second light into a third light with a peak wavelength larger than 500 nm.

According to another embodiment of this application, a manufacturing method of the light-emitting device is provided. The manufacturing method includes the following steps: disposing a first light-emitting unit and a second light-emitting unit on a temporary substrate, wherein the first light-emitting unit is used for emitting a first light with a peak wavelength not larger than 500 nm, and the second light-emitting unit is used for emitting a second light with a peak wavelength not larger than 500 nm; forming a reflective dam between the first light-emitting unit and the second light-emitting unit, wherein the reflective dam surrounds the first light-emitting unit and the second light-emitting unit; and, providing a color layer adhering to the first light-emitting unit and the second light-emitting unit, wherein the color layer including a first region and a second region, wherein the first region allows the first light directly penetrate thereof, and the second region converts the second light into a third light with a peak wavelength larger than 500 nm.

BRIEF DESCRIPTION OF THE DRAWINGS

FIGS. 3A1~3G2 show a manufacturing process of the light-emitting device disclosed in FIG. 1B.

DETAILED DESCRIPTION OF PREFERRED EMBODIMENTS

Figure 1A:
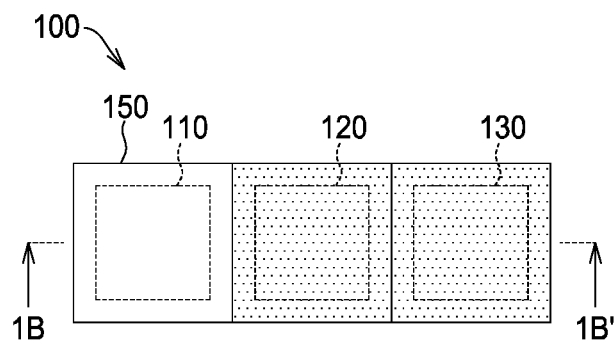
FIG. 1A shows a top view of a light-emitting device in accordance with one embodiment of present application.

The embodiments of the application are illustrated in details, and are plotted in the drawings. The same or the similar parts in the drawings and the specification have the same reference numeral. In the drawings, the shape and thickness of a specific element could be shrunk or enlarged. It should be noted that the element which is not shown in the drawings or described in the following description could be the structure well-known by the person having ordinary skill in the art.

Figure 1B:
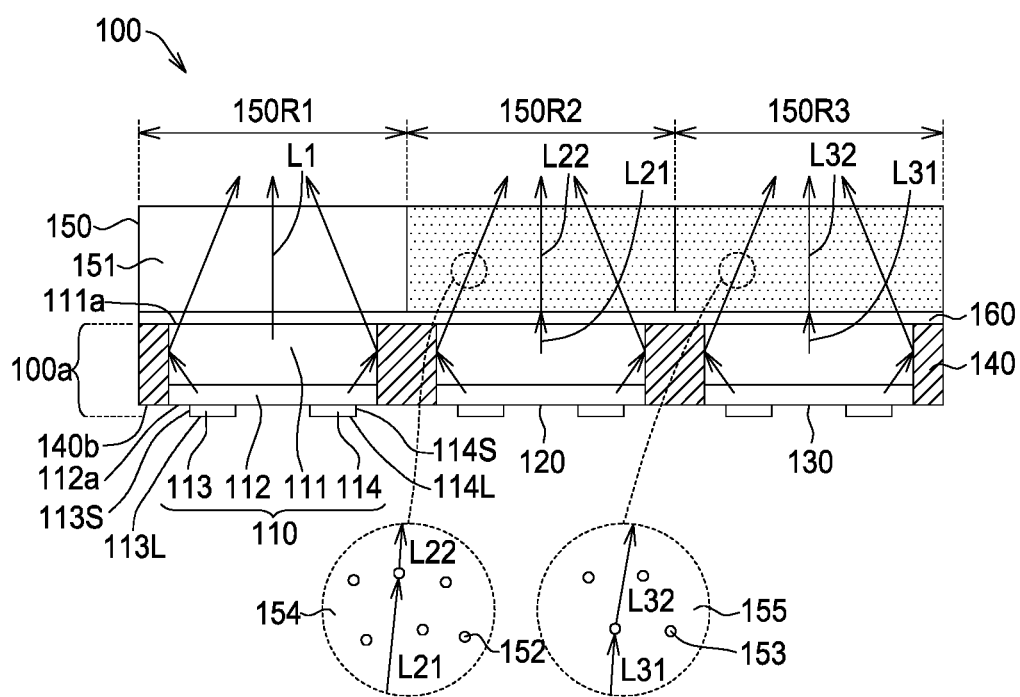
FIG. 1B shows a cross-sectional view of the light-emitting device disclosed in FIG. 1A along a direction 1B-1B'.

Referring to FIGS. 1A and 1, FIG. 1A shows a top view of a light-emitting device 100 in accordance with one embodiment of present application, and FIG. 1B shows a cross-sectional view of the light-emitting device 100 in FIG. 1A along a direction 1B-1B'. The light-emitting device 100 includes a first light-emitting unit 110, a second light-emitting unit 120, a third light-emitting unit 130, a reflective dam 140, a color layer 150, and an adhesive layer 160. In one embodiment, the first light-emitting unit 110, the second light-emitting unit 120, and the third light-emitting unit 130 are able to emit lights with the same peak wavelengths or colors. For example, the first light-emitting unit 110, the second light-emitting unit 120, and the third light-emitting unit 130 are able to emit lights with wavelengths not larger than 500 nm, such as blue light whose dominant wavelength or peak wavelength of blue light is about between 430 nm~490 nm. In another embodiment, the lights which are emitted from the first light-emitting unit 110, the second light-emitting unit 120, and the third light-emitting unit 130 are not limited to blue light, but also can be the light have other wavelength, such as purple light or UV light. The dominant wavelength or peak wavelength of purple light is about between 400 nm~430 nm. The peak wavelength of UV light is about between 315 nm~400 nm. In another embodiment, the first light-emitting unit 110, the second light-emitting unit 120, and the third light-emitting unit 130 are able to emit the lights with different wavelengths or different colors. In one embodiment, the first light-emitting unit 110 emits a blue light, and the second light-emitting unit 120, and the third light-emitting unit 130 emit UV lights. In one embodiment, the first light-emitting unit 110, the second light-emitting unit 120, and the third light-emitting unit 130 can be light-emitting diodes.

As FIG. 1B shows, the first light-emitting unit 110 includes a substrate 111, a light-emitting stack 112, a first electrode 113, and a second electrode 114. The substrate 111 includes an outer surface 111a (also known as a first outer surface), and the light-emitting stack 112 includes an outer surface 112a (also known as a second outer surface). In one embodiment, the substrate 111 is a growth substrate, such as sapphire substrate, for epitaxial growing the light-emitting stack 112. In another embodiment, the substrate 111 is not a growth substrate. The growth substrate is removed during manufacturing the first light-emitting unit 110 and replaced by another substrate, which is different from the growth substrate in material, structure, or shape. The light-emitting stack 112 includes multiple semiconductor layers, which is not shown. For example, the light-emitting stack 112 includes a first type semiconductor layer, a light-emitting layer, and a second type semiconductor layer, wherein the light-emitting layer is between the first type semiconductor layer and the second type semiconductor layer. As the first type semiconductor layer is n-type semiconductor layer, the second type semiconductor layer is p-type type semiconductor layer; as the first type semiconductor layer is p-type semiconductor layer, the second type semiconductor layer is n-type type semiconductor layer. In one embodiment, the first electrode 113 and the second electrode 114 are disposed on the same side of the first light-emitting unit 110 to be interfaces of the first light-emitting unit 110 to connect to external power supply.

As FIG. 1B shows, the reflective dam 140 directly contacts side surfaces of the first light-emitting unit 110, the second light-emitting unit 120, and the third light-emitting unit 130, so there is no gap between the reflective dam 140 and the side surfaces. Thus, a first light L1, a second light L21, and a fourth light L31 directly hit the reflective dam 140 after they are emitted. In another embodiment, the reflective dam 140 can directly contact a portion of the side surfaces of the first light-emitting unit 110, the second light-emitting unit 120, and the third light-emitting unit 130. Or, in one embodiment, there is a space between the reflective dam 140 and each of the side surfaces of the first light-emitting unit 110, the second light-emitting unit 120, and the third light-emitting unit 130. In one embodiment, the reflective dam 140 includes a bevel or curved surface (not shown), so a thickness of the reflective dam 140 is varied. In one embodiment, the thickness of the reflective dam 140 increases from the first outer surface to the second outer surface.

As FIG. 1B shows, the first light-emitting unit 110, the second light-emitting unit 120, the third light-emitting unit 130, and the reflective dam 140 form a light-emitting region 100a. The adhesive layer 160 is between the light-emitting region 100a and the color layer 150 for fixing the related positions of the light-emitting region 100a and the color layer 150. The adhesive layer 160 includes but is not limited to a transparent resin, wherein the transparent resin includes but is not limited to silicone, epoxy resin, or other synthetic resin. In another embodiment, the light-emitting device 100 does not include the adhesive layer 160, and the color layer 150 and the light-emitting region 100a can directly adhere to each other.

As FIG. 1B shows, a lower surface 140b of the reflective dam 140 and the outer surface 112a of the light-emitting stack 112 are approximately coplanar. And, the first electrode 113 and second electrode 114 protrude the outer surface 112a of the light-emitting stack 112, or a side wall 113S, 114S and a lower surface 113L, 114L of each of the first electrode 113 and second electrode 114 are not covered by the reflective dam 140. Thus, when the light-emitting device 100 is disposed on an electronic device (not shown), more surface of the first electrode 113 and second electrode 114 are covered by the electrically conductive material, such as solder paste, for improving the strength of the adhesion between the light-emitting device 100 and the electronic device. The electronic device mentioned here can be circuit board. Besides, the relationships between the second light-emitting unit 120 and the reflective dam 140 and between the third light-emitting unit 130 and the reflective dam 140 are similar to or the same as the relationship between the first light-emitting unit 110 and the reflective dam 140. The description is not repeated.

In one embodiment, the composition of the reflective dam 140 includes resin and reflective particles dispersing in the resin, such as titanium oxide, zinc oxide, aluminum oxide, barium sulfate or calcium carbonate. In one embodiment, the reflective particles include titanium oxide, wherein the weight ratio of titanium oxide to the reflective dam 140 is not smaller than 60%. In another embodiment, the weight ratio of titanium oxide to the reflective dam 140 is between 10%~60%. In one embodiment, the thickness of the reflective dam 140 is between 10 μm and 200 μm. In another embodiment, the thickness of the reflective dam 140 is between 20 μm and 100 μm.

As FIG. 1B shows, the color layer 150 includes a first region 150R1, a second region 150R2, and a third region 150R3. The first region 150R1 covers the first light-emitting unit 110 and permits the first light L1 to pass through thereof. The second region 150R2 covers the second light-emitting unit 120 and includes wavelength converting material (also known as a first wavelength converting material) for converting the second light L21 into a third light L22 with a peal wavelength larger than 500 nm, such as from blue light into green light, wherein the wavelength of the green light is between 510 nm and 560 nm. Similarly, the third region 150R3 covers the third light-emitting unit 130 and includes another wavelength converting material (also known as a second wavelength converting material) for converting the fourth light L31 into a fifth light L32 with a peal wavelength larger than 500 nm. The wavelength of the fifth light L32 can be different from the wavelength of the third light L22. For example, the fifth light L32 is a red light, and the wavelength of the red light is between 600 nm and 660 nm. In another embodiment, the colors of the third light L22 and the fifth light L32 can be different from the aforesaid colors thereof. The first region 150R1, the second region 150R2, and the third region 150R3 can emit different color lights, and the color arrangement can be adjusted by requirement. In another embodiment, the first region 150R1 emits a green light, the second region 150R2 emits a red light, and the third region 150R3 emits a blue light.

In the color layer 150, the first region 150R1 can include transparent material (also known as a first transparent material), the second region 150R2 can include the first wavelength converting material 152, and the third region 150R3 can include the second wavelength converting material 153. In one embodiment, the second region 150R2 includes a transparent material 154 (also known as a second transparent material) and the first wavelength converting material 152 dispersing in the second transparent material 154. In one embodiment, the third region 150R3 includes a transparent material 155 (also known as a third transparent material) and the second wavelength converting material 153 dispersing in the third transparent material 155, wherein the third transparent material 155 can be silicone or epoxy resin. The first transparent material, the second transparent material and the third transparent material can be the same or different. The first wavelength converting material 152, for example, can be fluorescent particles for converting the second light L21 into the third light L22. And, the second wavelength converting material 153, for example, can be fluorescent particles for converting the fourth light L31 into the fifth light L32. The first region 150R1 of the color layer 150 includes only a transparent material 151 without any wavelength converting material, so the first light L1 passing through the first region 150R1 keeps its original color. The second region 150R2 includes the transparent material 154 and the first wavelength converting material 152, and is consequently able to convert the second light L21 into the third light L22 which has a wavelength different from that of the second light L21. The third region 150R3 includes the third transparent material 155 and the second wavelength converting material 153 and is consequently able to convert the fourth light L31 into the fifth light L32 which has a wavelength different from that of the fourth light L31. In another embodiment, in the color layer 150, the first region 150R1 includes the first wavelength converting material, the second region 150R2 includes the second wavelength converting material, and the third region 150R3 includes a third wavelength converting material (not shown).

In one embodiment, the color layer 150 can be formed with the transparent material 151 mixing with the first wavelength converting material 152 and/or the second wavelength converting material 153, wherein the region without mixing the wavelength converting material is defined as the first region 150R1, the region mixing the first wavelength converting material 152 is defined as the second region 150R2 and the region mixing the second wavelength converting material 153 is defined as the third region 150R3. During the manufacturing process of the light-emitting device 100, the color layer 150 can be attached to the light-emitting unit after the color layer 150 is pre-made. In addition, the color layer 150 is in a form of a sheet and is flexible.

In one embodiment, the first wavelength converting material 152 and/or the second wavelength converting material 153, and/or the third wavelength converting material can be phosphor, organic fluorescent colorant, semiconductor or the combination thereof. The semiconductor comprises nanocrystal semiconductor, such as quantum-dot light-emitting material. In one embodiment, the material of phosphor is fluorescent powder comprising $Y_3Al_5O_{12}$:Ce, $Gd_3Ga_5O_{12}$:Ce, $Lu_3Al_5O_{12}$:Ce, $(Lu, Y)_3Al_5O_{12}$:Ce, $Tb_3Al_5O_{12}$:Ce, SrS: Eu, $SrGa_2S_4$: Eu, $(Sr, Ca, Ba) (Al, Ga)_2S_4$: Eu, (Ca, Sr) S:(Eu, Mn), (Ca, Sr) S Ce, $(Sr, Ba, Ca)_2Si_5N_8$: Eu, (Sr, Ba, Ca)(Al, Ga)Si $N_3$: Eu, $SrLiAl_3N_4$: $Eu^{2+}$, CaAlSi ON: Eu, $(Ba, Sr, Ca)_2SiO_4$: Eu, $(Ca, Sr, Ba)_8MgSi_4O_{16}(F, Cl, Br)_2$: Eu, $(Ca, Sr, Ba) Si_2O_2N_2$: Eu, $K_2SiF_6$: Mn, $K_2TiF_6$: Mn, or $K_2SnF_6$: Mn. The material of semiconductor comprises II-VI semiconductor, III-V semiconductor or IV-VI semiconductor or combination thereof. The quantum-dot comprises a core and a shell covering the core. The core comprises ZnS, ZnSe, ZnTe, ZnO, CdS, CdSe, CdTe, $CsPbCl_3$, $CsPbBr_3$, $CsPbI_3$, GaN, GaP, GaSe, GaSb, GaAs, AlN, AlP, AlAs, InP, InAs, Te, PbS, InSb, PbTe, PbSe, SbTe, ZnCdSe, ZnCdSeS, or CuInS.

In the embodiment, the color layer 150 is able to convert one color light into another color light. For example, the second region 150R2 is able to convert the second light L21 into the third light L22. In other words, the third light L22 is formed by totally converting the second light L21 and is not formed by mixing two color lights. Similarly, the fifth light L32 is formed by totally converting the fourth light L31 and is not formed by mixing two color lights.

As shown in FIG. 1B, the first light-emitting unit 110 is able to emit the first light L1, the second light-emitting unit 120 is able to emit the second light L21, and the third light-emitting unit 130 is able to emit the fourth light L31. The reflective dam 140 is disposed between the first light-emitting unit 110 and the second light-emitting unit 120 and between the second light-emitting unit 120 and the third light-emitting unit 130. And, the reflective dam 140 surrounds the side surfaces of the first light-emitting unit 110, the second light-emitting unit 120 and the third light-emitting unit 130 for reflecting the first light L1, the second light L21, and the fourth light L31 to travel toward the color layer 150. Thus, the lights emitted from the light-emitting units can be prevented from mixing before entering the color layer 150.

The aforesaid embodiment is explained by the example of the light-emitting device 100 with three light-emitting units. In another embodiment, the light-emitting device 100 can omit one of the second light-emitting unit 120 and the third light-emitting unit 130 and the corresponding second region 150R2 or the third region 150R3.

In summary, the light-emitting device 100 is able to emit at least two different colors to form a self-luminous light-emitting device. The light-emitting device 100 can be integrated in a display. For example, the light-emitting device 100 can be integrated with the liquid crystal display panel to display a color image. In such design, the display device can omit color filter and backlight module. In other words, this display device is capable of being self-luminous like organic light-emitting diode. In configuration, one region of the light-emitting device 100 (the first region 150R1, the second region 150R2 or the third region 150R3) can correspond to one pixel of the liquid crystal display panel.

Figure 2A:
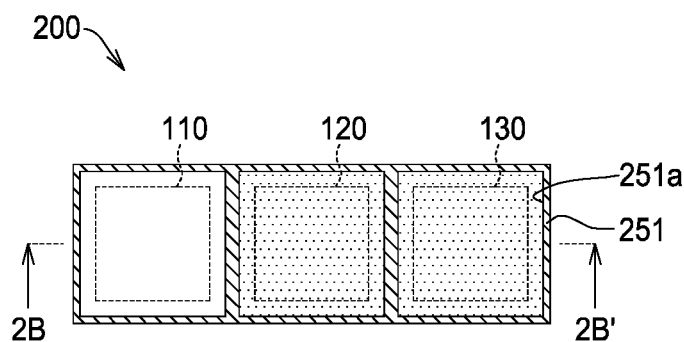
FIG. 2A shows a top view of a light-emitting device in accordance with another embodiment of present application.
Figure 2B:
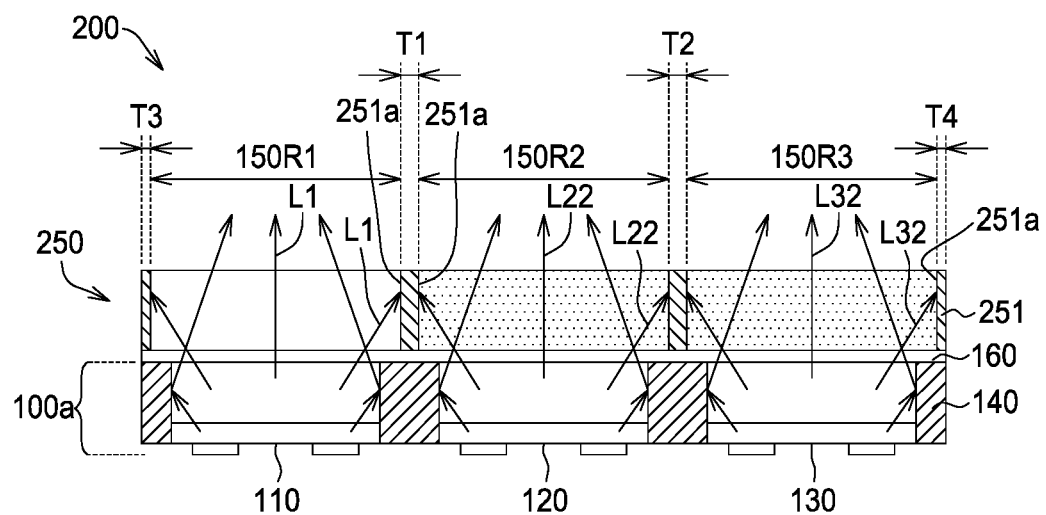
FIG. 2B shows a cross-sectional view of the light-emitting device disclosed in FIG. 2A along a direction 2B-2B'.

Referring to FIGS. 2A and 2B, FIG. 2A shows a top view of a light-emitting device 200 in accordance with another embodiment of present application, and FIG. 2B shows a cross-sectional view of the light-emitting device 200 disclosed in FIG. 2A along a direction 2B-2B'. The light-emitting device 200 includes a first light-emitting unit 110, a second light-emitting unit 120, a third light-emitting unit 130, a reflective dam 140, a color layer 250, and an adhesive layer 160.

The light-emitting device 200 has a structure similar to the structure of the light-emitting device 100. The difference between the light-emitting device 200 and the light-emitting device 100 is that the structure of the color layer 250 is different from that of the color layer 150.

The color layer 250 includes a first region 150R1, a second region 150R2, a third region 150R3 and a light absorbing region 251. The light absorbing region 251 is between the first region 150R1, the second region 150R2, and the third region 150R3 and surrounds the side surface of each of the first region 150R1, the second region 150R2, and the third region 150R3. For example, the light absorbing region 251 directly contacts the side surface of the first region 150R1, the side surface of the second region 150R2 and the side surface of the third region 150R3. The light absorbing region 251 has a plurality of grids 251a, wherein the grids 251a are the through holes of the light absorbing region 251. One region of the color layer 250, such as the first region 150R1, the second region 150R2 or the third region 150R3, corresponds to one grid 251a. Any two neighboring regions of the coloring region 250 are separated by the grid 251a.

The light absorbing region 251 is able to absorb the light passing through the color layer 250, such as the first light L1, the third light L22 and the fifth light L32, for preventing one light in one region of the color layer 250 from penetrating to another region and mixing with another light in thereof. Thus, the light emitted from the light-emitting device 200 can keep the original color from the color layer 250. In detail, the design of the light absorbing region 251 make the light-emitting device 200 be able to emit non-mixed blue, green and red light.

In one embodiment, the light absorbing region 251 has an optical density, OD, not smaller than 1. In another embodiment, the light absorbing region 251 has an optical density, OD, not smaller than 2. The optical density means the feature of shading light, OD=log (intensity of incident light/intensity of transmitted light). In the light absorbing region 251, a light absorbing thickness T1 is between the first region 150R1 and the second region 150R2, a light absorbing thickness T2 is between the second region 150R2 and the third region 150R3, a light absorbing thickness T3 is on the external surface of the first region 150R1 and a light absorbing thickness T4 is on the external surface of the third region 150R3, wherein the light absorbing thicknesses T1, T2, T3, T4 can be the same or different. In one embodiment, the light absorbing thicknesses T1, T2, T3, T4 are between 0.1 μm~100 μm. In one embodiment, a ratio of a width of the first region 150R1 to the light absorbing thickness is between 2~3000. In another embodiment, the ratio of the width of the first region 150R1 to the light absorbing thickness is between 5~30. In one embodiment, a ratio of the width of the first region 150R1 to a width of the first light-emitting unit 110 is between 1.2~2.0. In another embodiment, a ratio of the width of the first region 150R1 to width of the first light-emitting unit 110 is between 1.05~1.5. The material of the light absorbing region 251 can includes the light absorbing material, such as black resin, black ink or nickel plating layer.

FIGS. 3A1~3G2 show a manufacturing process of the light-emitting device 100 disclosed in FIG. 1B. FIG. 3A1 shows multiple light-emitting devices disposed on a temporary substrate, and FIG. 3A2 shows the cross sectional view of the structure disclosed in FIG. 3A1 along 3A2-3A2'. SMT (Surface Mount Technology) can be used in the step. At least one first light-emitting unit 110, at least one second light-emitting unit 120 and at least one third light-emitting unit 130 are disposed on a first temporary substrate 10, wherein the first light-emitting unit 110, the second light-emitting unit 120 and the third light-emitting unit 130 are respectively able to emit a first light L1, a second light L21 and a fourth light L31, of which the wavelengths are not larger than 500 nm.

As FIG. 3A1 shows, the multiple first light-emitting units 110, the multiple second light-emitting units 120, and the multiple third light-emitting units 130 are arranged in a straight line along one axis, such as X axis. In another embodiment, the line of the first light-emitting units 110, the line of the multiple second light-emitting units 120 and the line of the multiple third light-emitting units 130 are arranged in a straight line along an axis, such as Y axis.

As FIG. 3A2 shows, the first light-emitting unit 110 includes a substrate 111, a light-emitting stack 112, a first electrode 113 and a second electrode 114, wherein the light-emitting stack 112 including multiple semiconductor layers, the first electrode 113 and the second electrode 114 are formed under the substrate 111, so that the first light-emitting unit 110 is a flip chip. As shown in FIG. 3A2, a portion of the first electrode 113 and the second electrode 114 plug into the first temporary substrate 10. Therefore, as shown in FIGS. 3G2 and 1, the electrodes 113, 114 of the light-emitting device 100 can protrude a lower surface 140b of a reflective dam 140. In another embodiment, a terminal surface of the first electrode 113 and a terminal surface of the second electrode 114 are able to contact an upper surface 10u of the first temporary substrate 10 without plugging into the first temporary substrate 10. Besides, the structures of the second light-emitting unit 120 and the third light-emitting unit 130 are similar to or the same as that of the first light-emitting unit 110.

Then, as FIG. 3B shows, the reflective dam 140 can be formed on the first light-emitting unit 110, the second light-emitting unit 120, and the third light-emitting unit 130 by coating, wherein the reflective dam 140 surrounds the first light-emitting unit 110, the second light-emitting unit 120 and the third light-emitting unit 130. As FIG. 3B shows, the reflective dam 140 further covers the top surfaces of the first light-emitting unit 110, the second light-emitting unit 120, and the third light-emitting unit 130.

Then, as FIG. 3C shows, a portion of the reflective dam 140 can be removed by mechanical grinding, wet stripping or the combination thereof to expose a top surface 110u of the first light-emitting unit 110, a top surface 120u of the second light-emitting unit 120, and a top surface 130u of the third light-emitting unit 130. The wet stripping includes Water Jet Deflash or Wet Blasting Deflash. The theory of Water Jet Deflash is using a nozzle to eject liquid, such as water, to remove a portion of the reflective dam 140 by the liquid pressure. The theory of Wet Blasting Deflash is adding specific particles in liquid to remove a portion of the reflective dam 140 by the collision between liquid and particles. As FIG. 3C shows, the top surface 110u of the first light-emitting unit 110, the top surface 120u of the second light-emitting unit 120, the top surface 130u of the third light-emitting unit 130, and a top surface 140u of the reflective dam 140 are roughly aligned, such as flushed.

Then, FIG. 3D1 shows a color layer 150 disposed on the light-emitting units, and FIG. 3D2 shows a cross sectional view of the structure in FIG. 3D1 along 3D2-3D2'.

Figure 3E:
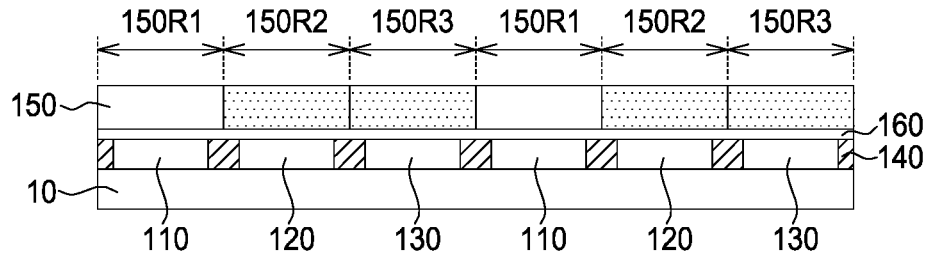
Figure 3E:
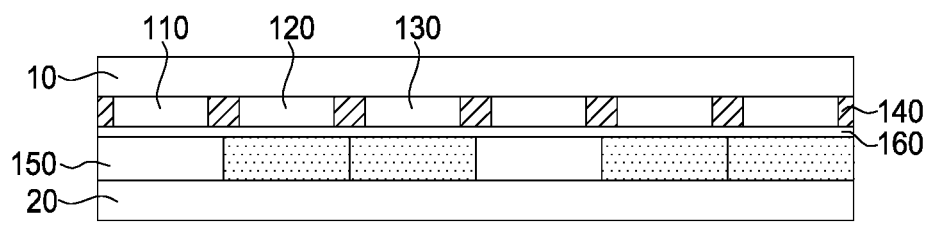

In the step, the color layer 150 is on the first light-emitting unit 110, the second light-emitting unit 120, and the third light-emitting unit 130, wherein the color layer 150 includes a first region 150R1, a second region 150R2 and a third region 150R3, and the first region 150R1, the second region 150R2 and the third region 150R3 are arranged in sequence, as shown in FIG. 3D1. The shape of the first region 150R1 is a strip that can cover the multiple first light-emitting units 110. Similarly, the shape of the second region 150R2 is a strip that can cover the multiple second light-emitting units 120, and the shape of the third region 150R3 is a strip that can cover the multiple third light-emitting units 130. Then, as shown in FIG. 3E, the whole structure in FIG. 3D2 is placed upside down to make the temporary substrate 10 facing up. Then, the whole upside down structure is disposed on a second temporary substrate 20. The second temporary substrate 20 can have an adhesion layer (not shown) for bonding to the color layer 150.

Figure 3F:
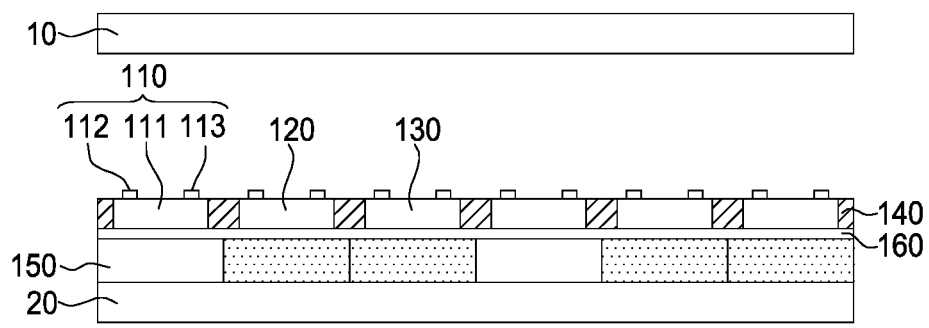

Then, as FIG. 3F shows, the first temporary substrate 10 disclosed in FIG. 3E is removed to expose the electrodes of the light-emitting units.

Then, FIG. 3G1 shows a top view of the multiple light-emitting devices 100, which is formed by cutting the structure disclosed in FIG. 3F, and FIG. 3G2 shows a cross sectional view of the structure disclosed in FIG. 3G1 along 3G2-3G2'. In the step, at least one cutting line is formed through the structure disclosed in FIG. 3F by dicing sword or laser to form the light-emitting device shown in FIG. 1B. Since the electrodes of the light-emitting units are facing up and exposed, the positions of the electrodes can be used for alignment in cutting step to improve the cutting accuracy. In cutting step, a cutting line C1 does not pass through the second temporary substrate 20. Though not shown in the figures, the cutting line C1 can remove a portion of the second temporary substrate 20 without breaking the portion of the second temporary substrate 20 under the cutting line C1 for transporting the multiple light-emitting devices 100 more conveniently. In one embodiment, the second temporary substrate 20 is a tape, such as blue tape, for separating the second temporary substrate 20 and the multiple light-emitting devices 100 easily.

Then, the second temporary substrate 20 and the multiple light-emitting devices 100 can be separated. Since the cutting line C1 does not penetrate the second temporary substrate 20, the multiple light-emitting devices 100 can be kept on the second temporary substrate 20 after the cutting process. So, it is more convenient to separate the multiple light-emitting devices 100 from the second temporary substrate 20.

Figure 4A:
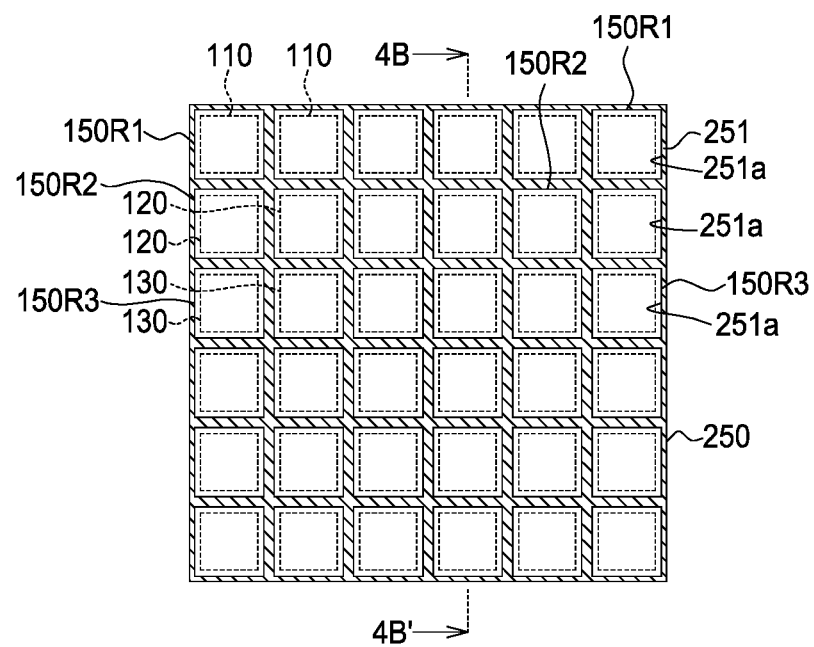
FIGS. 4A and 4B show a manufacturing process of the light-emitting device disclosed in FIG. 2B.
Figure 4B:
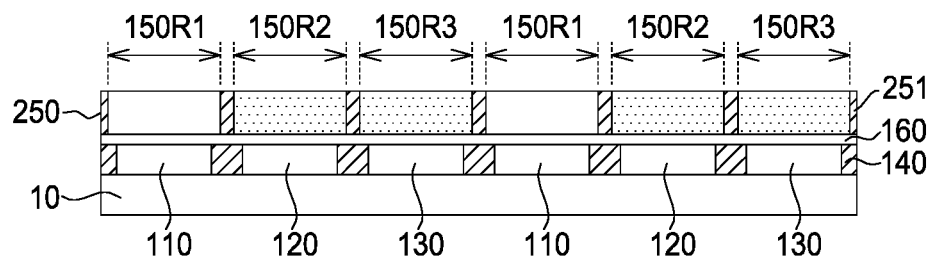

FIGS. 4A and 4B show a manufacturing process of the light-emitting device 200 in FIG. 2B. The manufacturing process of the light-emitting device 200 is similar to that of the light-emitting device 100, and the difference between thereof is the process of manufacturing a color layer 250.

As FIGS. 4A and 4B show, the color layer 250 is bonded to the first light-emitting unit 110, the second light-emitting unit 120 and the third light-emitting unit 130 with the adhesive layer 160. The color layer 250 includes the first regions 150R1, the second regions 150R2, the third regions 150R3 and a light absorbing region 251. The light absorbing region 251 surrounds the first regions 150R1, the second regions 150R2 and the third regions 150R3. The light absorbing region 251 has a plurality of grids 251a, and one of the first regions 150R1, the second regions 150R2 and the third regions 150R3 (such as one first regions 150R1, one second regions 150R2 or one third regions 150R3) corresponds to one of the plurality of grids 251a.

The other steps of the manufacturing process of the light-emitting device 200 are similar to those of the light-emitting device 100.

Figure 5A:
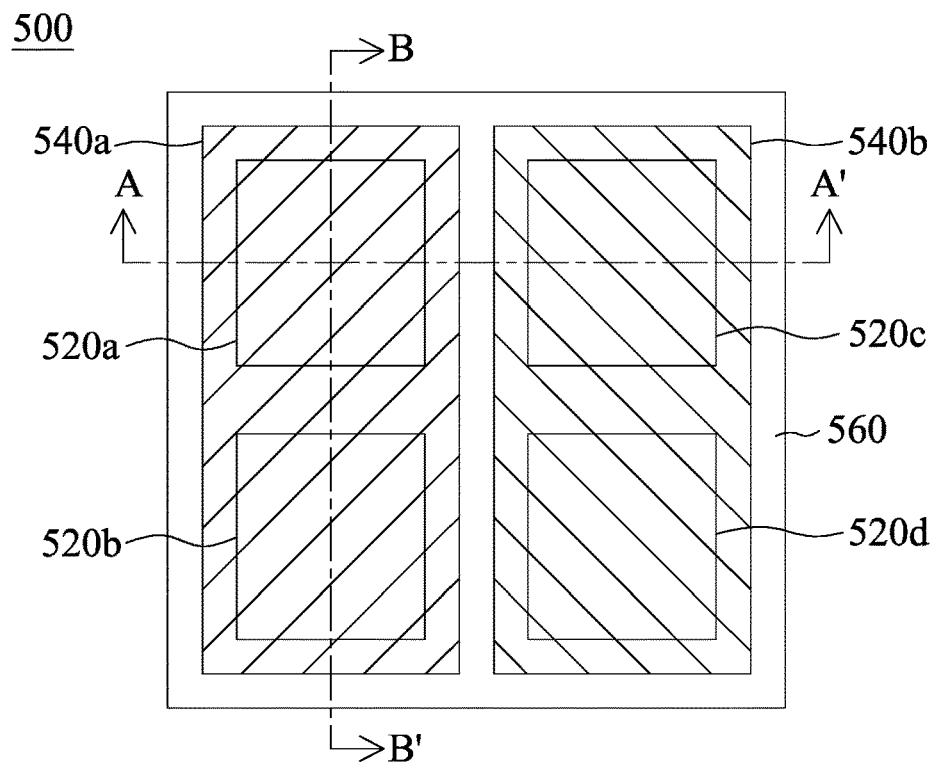
FIG. 5A shows a top view of a light-emitting device in accordance with one embodiment of present application.
Figure 5B:
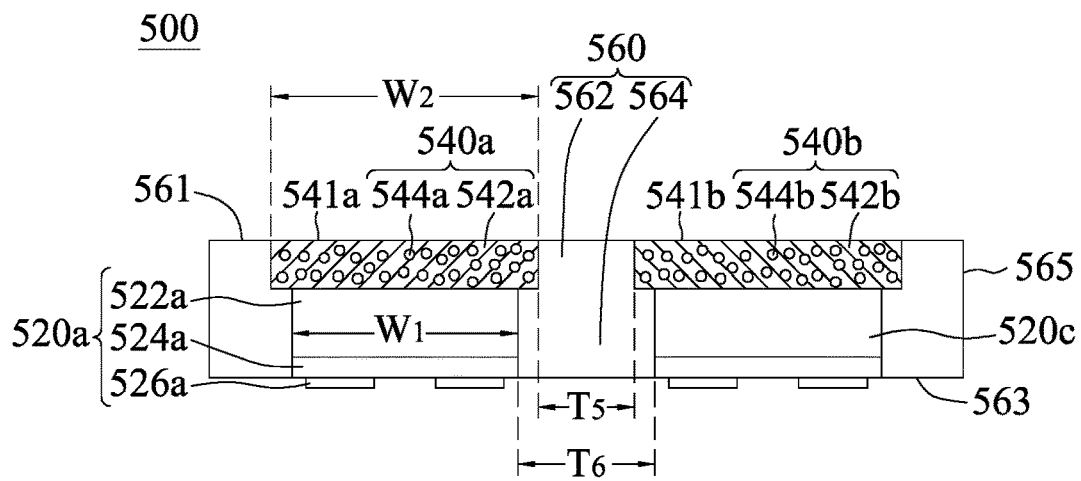
FIG. 5B shows a cross-sectional view of the light-emitting device disclosed in FIG. 5A along a direction A-A'.
Figure 5C:
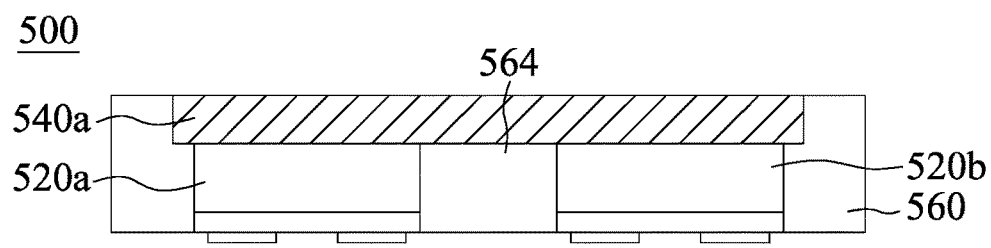
FIG. 5C shows a cross-sectional view of the light-emitting device disclosed in FIG. 5A along a direction B-B'.

FIG. 5A shows a top view of a light-emitting device 500 in accordance with one embodiment of present application. FIG. 5B shows a cross-sectional view of the light-emitting device 500 in FIG. 5A along a direction A-A'. FIG. 5C shows a cross-sectional view of the light-emitting device 500 in FIG. 5A along a direction B-B'.

The light-emitting device 500 includes a first light-emitting unit 520a, a second light-emitting unit 520b, a third light-emitting unit 520c, a fourth light-emitting unit 520d, a first wavelength converting layer 540a, a second wavelength converting layer 540b, and a reflective dam 560.

As FIG. 5A shows, in one embodiment, the first light-emitting unit 520a, the second light-emitting unit 520b, the third light-emitting unit 520c and the fourth light-emitting unit 520d are able to emit lights with the same wavelengths or colors. In another embodiment, the first light-emitting unit 520a, the second light-emitting unit 520b, the third light-emitting unit 520c, and the fourth light-emitting unit 520d are able to emit lights with different wavelengths or colors. The description of the wavelengths and structures of the light-emitting units can be referred to aforesaid paragraphs. In one embodiment, the first light-emitting unit 520a, the second light-emitting unit 520b, the third light-emitting unit 520c, and the fourth light-emitting unit 520d can be arranged in an array, such as 2*2 array. In one embodiment, the first light-emitting unit 520a, the second light-emitting unit 520b, the third light-emitting unit 520c and the fourth light-emitting unit 520d have approximately the same areas. In another embodiment, the first light-emitting unit 520a, the second light-emitting unit 520b, the third light-emitting unit 520c, and the fourth light-emitting unit 520d have different areas. In one embodiment, the first light-emitting unit 520a, the second light-emitting unit 520b, the third light-emitting unit 520c, and the fourth light-emitting unit 520d are separated from each other. In one embodiment, a spacing (the first spacing) is between the first light-emitting unit 520a and the second light-emitting unit 520b, a spacing (the second spacing) is between the third light-emitting unit 520c and the fourth light-emitting unit 520d, and the first spacing and the second spacing have approximately the same widths. Similarly, a spacing (the third spacing) is between the first light-emitting unit 520a and the third light-emitting unit 520c, a spacing (the fourth spacing) is between the second light-emitting unit 520b and the fourth light-emitting unit 520d, and the third spacing and the fourth spacing have approximately the same widths.

As FIG. 5A shows, in one embodiment, the first wavelength converting layer 540a covers the first light-emitting unit 520a and the second light-emitting unit 520b, and the second wavelength converting layer 540b covers the third light-emitting unit 520c and the fourth light-emitting unit 520d. In detail, the first wavelength converting layer 540a is located on the first light-emitting unit 520a, the first spacing, and the second light-emitting unit 520b. Similarly, the second wavelength converting layer 540b is located on the third light-emitting unit 520c, the second spacing, and the fourth wavelength converting layer 540d. In other words, the area of the first wavelength converting layer 540a is larger than the sum of the areas of the first light-emitting unit 520a and the second light-emitting unit 520b, and the area of the second wavelength converting layer 540b is larger than the sum of the areas of the third light-emitting unit 520c and the fourth light-emitting unit 520d. In another embodiment, the first wavelength converting layer 540a and the second wavelength converting layer 540b are staggered (not show), and, namely, the first wavelength converting layer 540a covers the first light-emitting unit 520a and the fourth light-emitting unit 520d, and the second wavelength converting layer 540b covers the second light-emitting unit 520b and the third light-emitting unit 520c.

In one embodiment, the first light-emitting unit 520a and the second light-emitting unit 520b emit a light with the first wavelength which is converted by the first wavelength converting layer 540a to a light with the second wavelength, and the light with the first wavelength and the light with the second wavelength are mixed to form a first mixed light. Similarly, the third light-emitting unit 520c and the fourth light-emitting unit 520d emit a light with the third wavelength which is converted by the second wavelength converting layer 540b to a light with the fourth wavelength, and the light with the third wavelength and the light with the fourth wavelength are mixed to form a second mixed light. The first mixed light and the second mixed light have different CCTs (Correlated Color Temperature) or CIE values. The different CCTs of the first mixed light and the second mixed light can be achieved by using different types of wavelength converting material and/or using the wavelength converting materials with different densities. In one embodiment, the first wavelength converting layer 540a includes a binding 542a and a wavelength converting material 544a (the first wavelength converting material), and the second wavelength converting layer 540b includes a binding 542b and a wavelength converting material 544b (the second wavelength converting material). In one embodiment, the CCT of the first mixed light is smaller than the CCT of the second mixed light, so the density of the first wavelength converting material 544a is larger than the density of the second wavelength converting material 544b. In one embodiment, the difference of CCT between the first mixed light and the second mixed light is at least 2000k. Besides, when the light-emitting device 500 is driven to emit a light, the CCT of the light is changeable, which can be adjusted in a range between the two CCTs of the first mixed light and the second mixed light. In one embodiment, the adjusted CCT of the light emitted from the light-emitting device 500 is between 2000k~6000k. In another embodiment, the adjusted CCT of the light emitted from the light-emitting device 500 is between 2000k~8000k.

As FIG. 5A shows, the reflective dam 560 surrounds the first light-emitting unit 520a, the second light-emitting unit 520b, the third light-emitting unit 520c and the fourth light-emitting unit 520d. Besides, the reflective dam 560 surrounds the first wavelength converting layer 540a and the second wavelength converting layer 540b. The reflective dam 560 includes a top surface 561, a bottom surface 563 and a side surface between the top surface 561 and the bottom surface 563. The reflective dam 560 is able to reflect the lights from the light-emitting units and the wavelength converting layers and decrease the light angle. In one embodiment, the reflective dam 560 has a reflective index larger than 50% for the lights with wavelengths in 450 nm and 560 nm. The material of the reflective dam 560 can be referred to the aforesaid paragraphs.

As FIG. 5B shows, in one embodiment, a width W2 of the first wavelength converting layer 540a is larger than a width W1 of the first light-emitting unit 520a. Similarly, a width of the second wavelength converting layer 540b is larger than a width of the third light-emitting unit 520c. In another embodiment, the width W2 of the first wavelength converting layer 540a is approximately equal to the width W1 of the first light-emitting unit 520a. In one embodiment, as FIG. 5B shows, the reflective dam 560 includes an upper portion 562 and a lower portion 564. The upper portion 562 is able to separate the first wavelength converting layer 540a and the second wavelength converting layer 540b and has a thickness T5. The lower portion 564 is able to separate the first light-emitting unit 520a and the third light-emitting unit 520c and has a thickness T6. In one embodiment, the thickness T5 of the upper portion 562 is smaller than the thickness T6 of the lower portion 564. In one embodiment, the thickness T5 of the upper portion 562 is not larger than 100 µm, and the thickness T6 of the lower portion 564 is not larger than 325 µm. If the thickness T6 of the lower portion 564 is larger than 325 µm, the size of the light-emitting device 500 cannot be decreased. In another embodiment, the thickness T5 of the upper portion 562 is between 25 µm~100 µm. If the thickness T5 of the upper portion 562 is smaller than 25 µm, the upper portion 562 may not prevent the lights from the first light-emitting unit 520a and/or the third light-emitting unit 520c from penetrating to the neighboring light-emitting unit or the neighboring wavelength converting layer, and such that the crosstalk may occur. In another embodiment, the thickness T6 of the lower portion 564 is between 200 µm and 325 µm. In one embodiment, the first wavelength converting layer 540a has an upper surface 541a, and the second wavelength converting layer 540b has an upper surface 541b. The upper surface 5a of the first wavelength converting layer 540a, the upper surface 541b of the second wavelength converting layer 540b and the top surface 561 of the reflective dam 560 are approximately coplanar. Next, referring to FIG. 5C, the first wavelength converting layer 540a continuously extends from the first light-emitting unit 520a to the second light-emitting unit 520b so there is no upper portion 562. The lower portion 564 separates the first light-emitting unit 520a and the second light-emitting unit 520b.

Figure 5D:
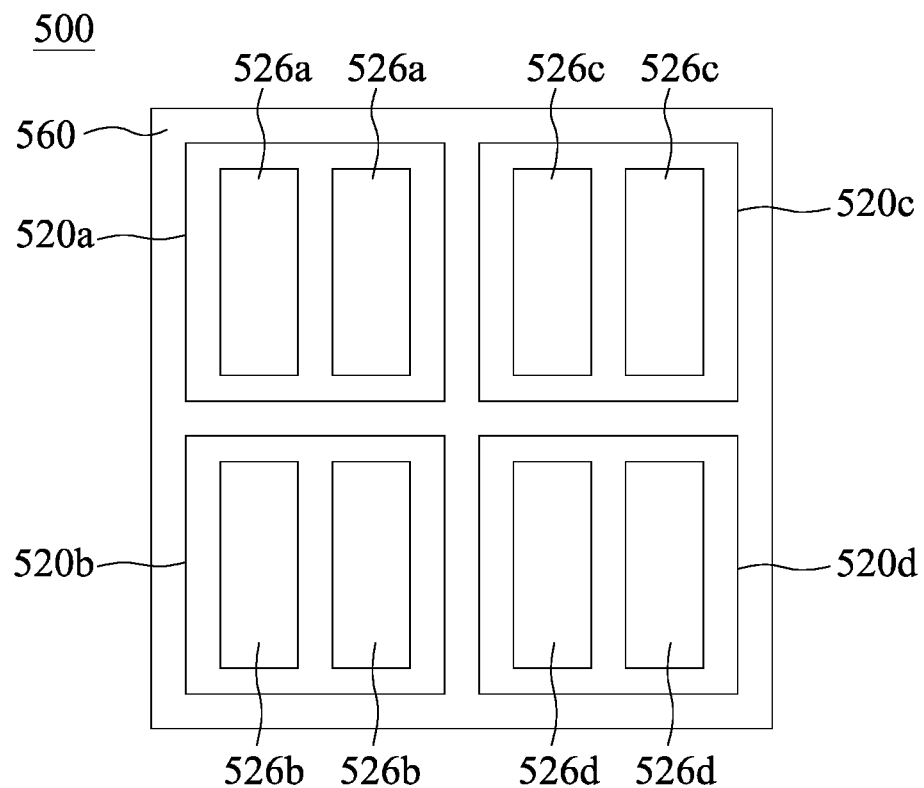
FIG. 5D shows a bottom view of the light-emitting device disclosed in FIG. 5A.

FIG. 5D shows a bottom view of the light-emitting device 500 disclosed in FIG. 5A. The first light-emitting unit 520a includes two electrodes 526a (the first pair of electrodes) on the bottom thereof, the second light-emitting unit 520b includes two electrodes 526b (the second pair of electrodes) on the bottom thereof, the third light-emitting unit 520c includes two electrodes 526c (the third pair of electrodes) on the bottom thereof, and the fourth light-emitting unit 520d includes two electrodes 526d (the fourth pair of electrodes) on the bottom thereof. The bottom of the first light-emitting unit 520a, the bottom of the second light-emitting unit 520b, the bottom of the third light-emitting unit 520c, and the bottom of the fourth light-emitting unit 520d is exposed and are not blocked by the reflective dam 560.

In the light-emitting device 500, through the reflective dam 560, the first light-emitting unit 520a is connected with the third light-emitting unit 520c, and the first wavelength converting layer 540a is connected with the second wavelength converting layer 540b. In such design, thickness of another reflective dam and the spacing between the reflective dams can be decreased, and the size of the light-emitting device 500 can also be decreased. It is great helpful for the miniaturization design of electronic products with the light-emitting devices 500.

Figure 6A:
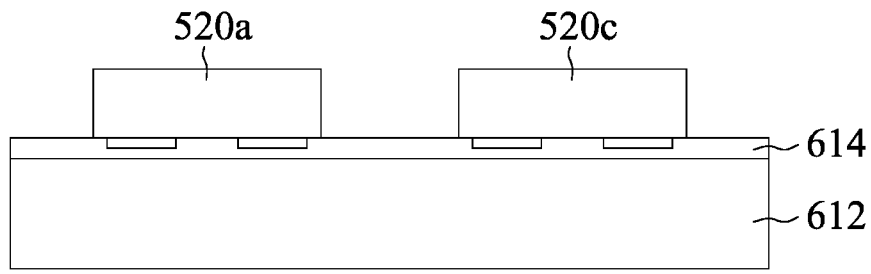
FIGS. 6A-6I show a manufacturing process of the light-emitting device disclosed in FIG. 5A.

FIGS. 6A~6I show a manufacturing process of the light-emitting device 500 disclosed in FIG. 5A. Referring to FIG. 6A, a temporary substrate 612 is provided, an adhesive layer 614 is formed on the temporary substrate 612, and the light-emitting units 520a, 520c are on the temporary substrate 612, wherein the number of the light-emitting units is only for illustration. In the embodiment, the number of the light-emitting units is 4 or multiples thereof. In one embodiment, the D can be glass, sapphire, metal or plastic for support. The adhesive layer 614 is used for temporarily fixing the light-emitting units 520a, 520c. In one embodiment, the adhesive layer 614 is a thermal curing adhesive. In the step, the adhesive layer 614 is not fully cured and is still viscous. In another embodiment, the adhesive layer 614 is a photo curing adhesive.

Figure 6B:
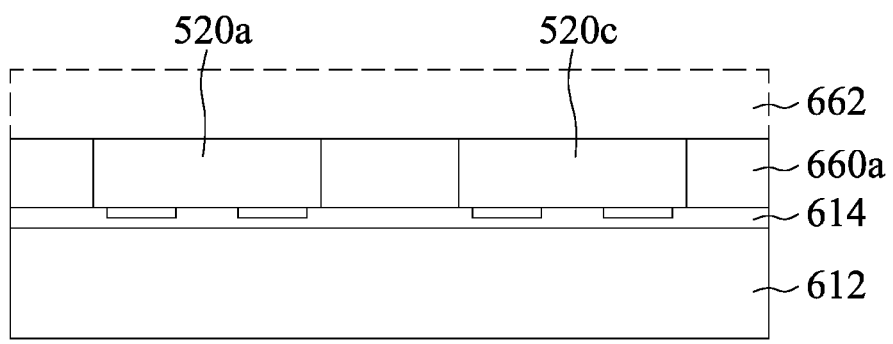

Referring to FIG. 6B, in one embodiment, a lower portion of the reflective dam 660a is disposed on the temporary substrate 612. The height of the lower portion of the reflective dam 660a is approximately equal to the thicknesses of the light-emitting units 520a, 520c. In one embodiment, a reflective dam material (the first reflective dam material) is covered on the light-emitting units 520a, 520c firstly, and then a portion of the reflective dam material 662 is removed to form the lower portion of the reflective dam 660a. The method of removing the reflective dam material 662 includes mechanical grinding, wet stripping or the combination thereof. The wet stripping includes Water Jet Deflash or Wet Blasting Deflash. The theory of Water Jet Deflash is using a nozzle to eject liquid, such as water, to remove a portion of the reflective dam material 662 by the liquid pressure. The theory of Wet Blasting Deflash is adding specific particles in liquid to remove a portion of the reflective dam material 662 by the collision between liquid and particles.

Figure 6C:
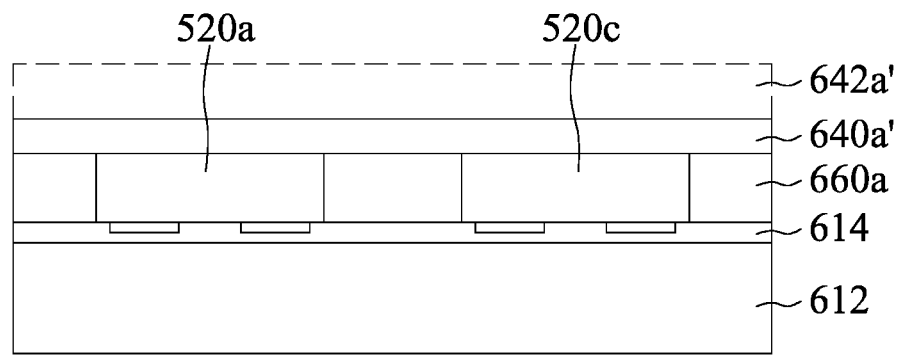
Figure 6D:
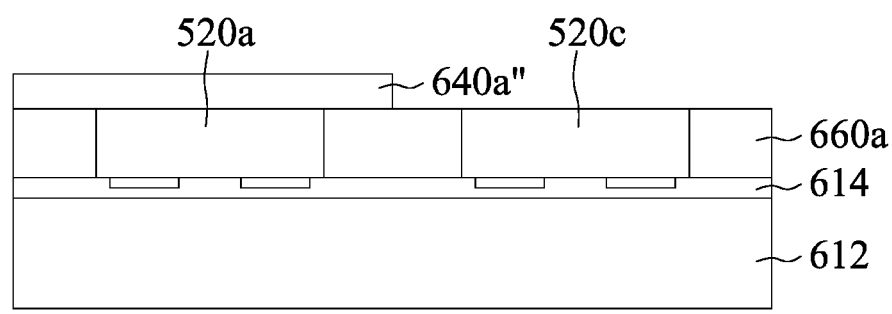

Referring to FIG. 6C, in one embodiment, a first wavelength converting layer material 640a' covers the lower portion of the reflective dam 660a. In one embodiment, by removing a portion of the first wavelength converting material layer 642a', the first wavelength converting layer material 640a' can be thinned to a predetermined thickness. Referring to FIG. 6D, in one embodiment, a part of the first wavelength converting layer material 640a' is removed to expose the light-emitting unit 520c and a part of the lower portion of the reflective dam 660a. Besides, a part of the first wavelength converting layer material 640a' is removed to form a first wavelength converting layer material 640a". In one embodiment, a part of the first wavelength converting layer material 640a' can be removed by sword cutting.

Figure 6E:
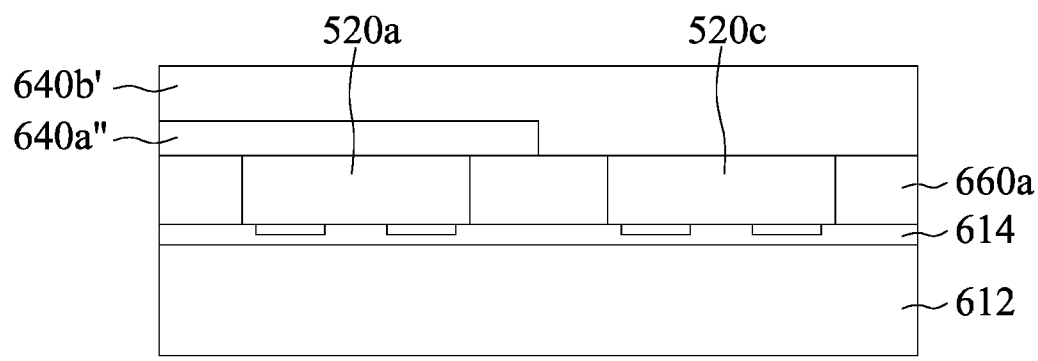
Figure 6F:
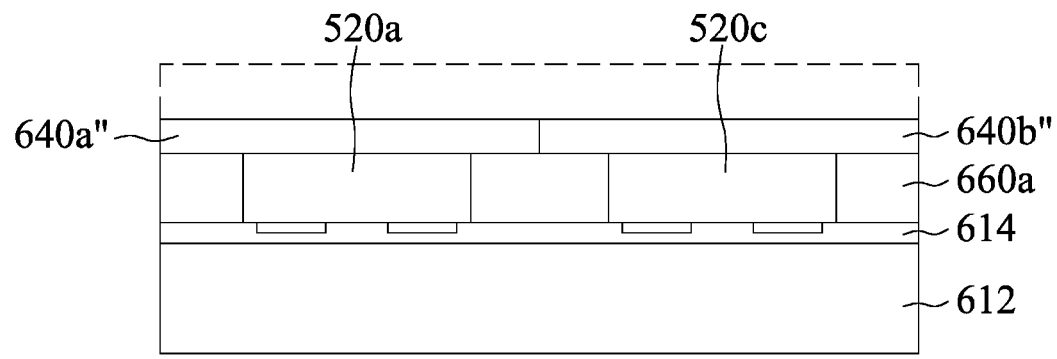

Referring to FIG. 6E, in one embodiment, a second wavelength converting layer material 640b' covers the lower portion of the reflective dam 660a, the light-emitting unit 520c and the first wavelength converting layer material 640a". Referring to FIG. 6F, in one embodiment, the second wavelength converting layer material 640b" is partially removed to expose the first wavelength converting layer material 640a". The method of removing the second wavelength converting layer material 640b" can be the same as or similar to the method of removing the reflective dam material.

Figure 6G:
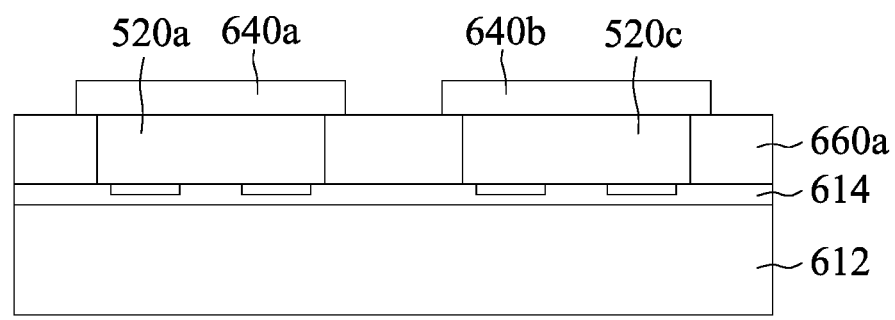

Referring to FIG. 6G, in one embodiment, the first wavelength converting layer material 640a" is partially removed and then formed a first wavelength converting layer 640a. Besides, the second wavelength converting layer material 640b" is partially removed to form a second wavelength converting layer 640b. In one embodiment, the method of removing the first wavelength converting layer material 640a" and the second wavelength converting layer material 640b" includes sword cutting.

Figure 6H:
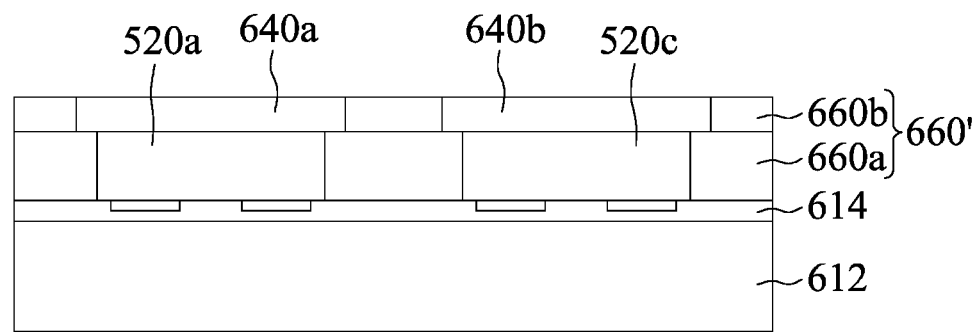
Figure 6I:
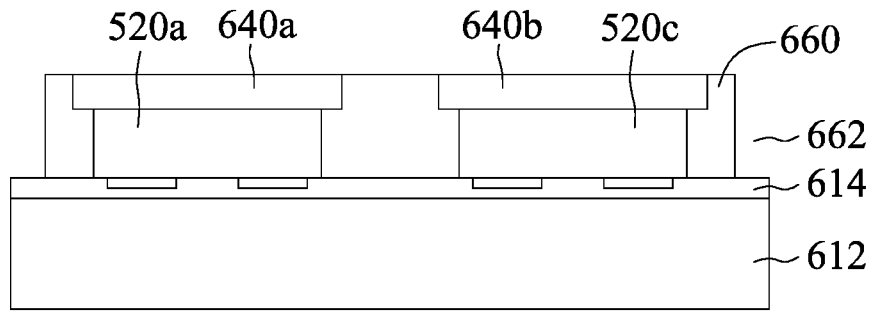

Referring to FIG. 6H, in one embodiment, an upper portion of the reflective dam 660b is disposed on the lower portion of the reflective dam 660a to form a reflective cover 660'. In one embodiment, the method of forming the upper portion of the reflective dam 660b includes forming a reflective dam material (the second reflective dam material) on the lower portion of the reflective dam 660a, and then removing a portion of the reflective dam material to expose the first wavelength converting layer 640a and the second wavelength converting layer 640b. The method of removing the second reflective dam material can be the same as or similar to the method of removing the first reflective dam material.

Referring to FIG. 6, in one embodiment, a part of the reflective cover 660' is removed (the removed portion of the reflective dam) to form a reflective dam 660 and form a light-emitting device. In one embodiment, the method of removing the reflective cover 660' can be sword cutting.

Figure 7A:
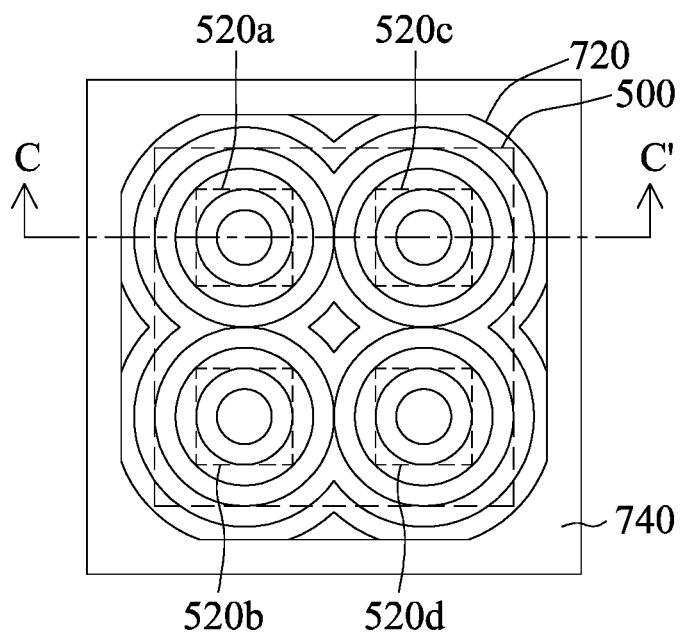
FIG. 7A shows a top view of a light-emitting module in accordance with an embodiment of present application.
Figure 7B:
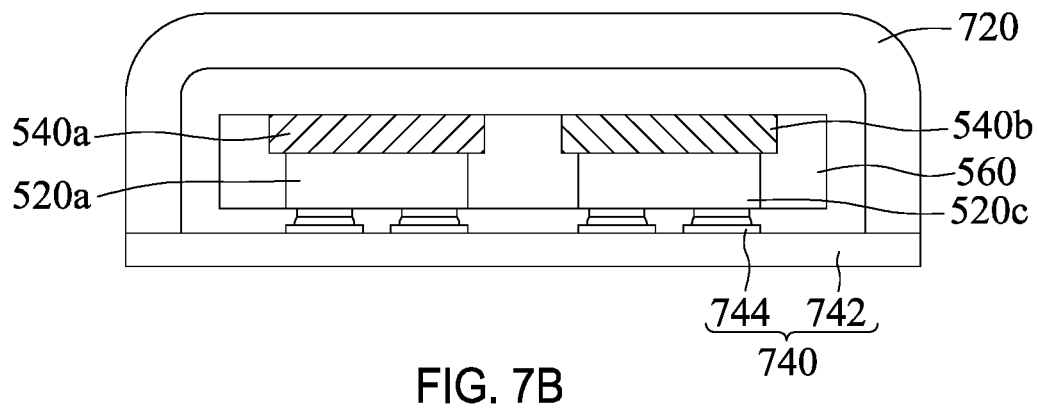
FIG. 7B shows a cross sectional view of the light-emitting module disclosed in FIG. 7A along C-C'.

Referring to FIGS. 7A and 7B, FIG. 7A shows a top view of a light-emitting module 700 in accordance with an embodiment of present application, and FIG. 7B shows a cross sectional view of the light-emitting module 700 in FIG. 7A along C-C'.

The light-emitting module 700 includes the light-emitting device 500, an optical unit 720, and a carrier board 740. Besides, the optical unit 720 covers the light-emitting device 500. Referring to FIG. 7B, in one embodiment, the optical unit 720 has a left portion and a right portion, wherein the left portion corresponds to the first light-emitting unit 520a and the first wavelength converting layer 640a, and the right portion corresponds to the third light-emitting unit 520c and the second wavelength converting layer 640b. Besides, the carrier board 740 is a circuit board having an insulating layer 742 and a circuit layer 744. The circuit layer 744 electrically connects to the light-emitting device 500. In one embodiment, the optical unit 720 is a Fresnel lens including multiple regions for respectively corresponding to the light-emitting units. Referring to FIG. 7A, the Fresnel lens has four groups of concentric circles respectively corresponding to the first light-emitting unit 520a, the second light-emitting unit 520b, the third light-emitting unit 520c, and the fourth light-emitting unit 520d. Therefore, the light-emitting device 500 is able to emit a light similar to or equal to directional light.

The light-emitting module 700 can be applied to the flash of the electrical device. By the light source with adjustable CCT, the white balance processing can be more sophisticated in different environments such that the image can be closer to the reality.

Although the present application has been explained above, it is not the limitation of the range, the sequence in practice, the material in practice, or the method in practice. Any modification or decoration for present application is not detached from the spirit and the range of such.

The invention claimed is:

1. A light-emitting device module, comprising:
   a light-emitting device, comprising:
      a first light-emitting unit, configured to emit a first light with a first peak wavelength not larger than 500 nm;
      a second light-emitting unit, configured to emit a second light with a second peak wavelength not larger than 500 nm;
      a separating dam, located between the first light-emitting unit and the second light-emitting unit; and
      a color layer, comprising a first region arranged above the first light-emitting unit, and a second region arranged above the second light-emitting unit;
   an optical unit, arranged above the light-emitting device, and including lens parts corresponding to the first light-emitting unit and the second light-emitting unit, respectively; and
   a carrier board carrying the light-emitting device and the optical unit, wherein the optical unit covers without directly contacting the light-emitting device,
   wherein a first mixed light with a component induced by the first region and a second mixed light with a component induced by the second region have different color temperatures.

2. The light-emitting device module according to claim 1, further comprising a third light-emitting unit covered by the first region.

3. The light-emitting device module according to claim 2, wherein the separating dam is located between the first light-emitting unit and the third light-emitting unit.

4. The light-emitting device module according to claim 1, wherein the second region comprises a transparent material and a wavelength converting material, the second light is converted by the wavelength converting material.

5. The light-emitting device module according to claim 1, wherein the first region is wider than the first light-emitting unit.

6. The light-emitting device module according to claim 1, wherein the separating dam surrounds the first light-emitting unit, the second light-emitting unit, the first region and the second region.

7. The light-emitting device module according to claim 1, wherein the separating dam directly contacts the first light-emitting unit and the first region.

* * * * *